United States Patent [19]
Kodai et al.

[11] Patent Number: 5,192,682
[45] Date of Patent: Mar. 9, 1993

[54] MANUFACTURING METHOD FOR THIN SEMICONDUCTOR DEVICE ASSEMBLIES

[75] Inventors: Syojiro Kodai, Itami; Osamu Murakami, Amagasaki, both of Japan

[73] Assignee: Mitsubishi Denki Kabushiki Kaisha, Tokyo, Japan

[21] Appl. No.: 697,963

[22] Filed: May 10, 1991

[30] Foreign Application Priority Data

May 10, 1990 [JP] Japan ................... 2-121554

[51] Int. Cl.$^5$ .................... H01L 21/52; H01L 21/56; H01L 21/58
[52] U.S. Cl. .................... 437/219; 437/927; 29/841
[58] Field of Search ............. 437/211, 214, 215, 216, 437/217, 219, 927; 235/380, 488, 492; 174/52.4; 29/831, 832, 841; 361/395

[56] References Cited

U.S. PATENT DOCUMENTS

| 4,746,392 | 5/1988 | Hoppe | 156/244.12 |
| 4,974,120 | 11/1990 | Kodai et al. | 361/392 |
| 5,057,460 | 10/1991 | Rose | 437/217 |
| 5,079,673 | 1/1992 | Kodai et al. | 174/52.2 |

FOREIGN PATENT DOCUMENTS 60-189587 9/1985 Japan.
60-217492 10/1985 Japan.

Primary Examiner—Olik Chaudhuri
Assistant Examiner—David E. Graybill
Attorney, Agent, or Firm—Leydig, Voit & Mayer

[57] ABSTRACT

A manufacturing method for a thin semiconductor device assembly includes forming an internal frame for positioning an IC module within an external frame that forms the periphery of the thin semiconductor device assembly, positioning the IC module in the internal frame so that an electrode terminal surface of the IC module is exposed, and fixing the IC module in place by filling the external and internal frames with resin.

8 Claims, 3 Drawing Sheets

MANUFACTURING METHOD FOR THIN SEMICONDUCTOR DEVICE ASSEMBLIES

BACKGROUND OF THE INVENTION

1. Field of the Invention

The present invention relates to a manufacturing method for thin semiconductor device assemblies such as IC cards.

2. Description of the Related Art

An IC card, such as that shown in FIGS. 6A and 6B, has been hitherto known. In these drawings, a card substrate 1 is a rectangular element which is formed by either laminating, for example, a vinyl chloride resin, or is molded from a resin such as an ABS resin. A recess 2 is formed on either surface of the card substrate 1. An IC module 3 is fitted into the recess 2 of the card substrate 1, being fixed by a bonding agent. The IC module 3 is provided with a circuit substrate 5 that has a first surface on which a wiring circuit (not shown) is formed, and a second surface on which electrode terminals 4 are formed. The IC module 3 is also provided with an IC 7 mounted on the first surface of the circuit substrate 5. Plural electrodes (not shown) of the IC 7 are connected through wires 6 (not shown) to the wiring circuit of the circuit substrate 5. The wires 6, the IC 7 and so forth are sealed by resin 8. As shown in FIG. 6A, the electrode terminal 4 formed on the second surface of the circuit substrate 5 is exposed.

The thus-constructed IC card has been heretofore manufactured in the following manner. First, the IC 7 and other components are mounted on the first surface of the circuit substrate 5, and the resin-sealed IC module 3 is also formed. Next, the card substrate 1 having the recess 2 is formed. The IC module 3 is then fitted into the recess 2 and is fixed in place by a bonding agent.

Conventionally, the size of the external shape of the IC module 3 must therefore conform to that of the recess 2 of the card substrate 1. For instance, various industrial standards prescribe that the permissible tolerance in height between the electrode terminal on the IC card and the surface of the IC card around the electrode terminal be less than 0.1 mm. For this reason, it is necessary to employ a highly precise process for the external shape of the IC module 3 and the recess 2 of the card substrate 1. This increases manufacturing costs.

When an IC card is manufactured, a stage is required for fixing the IC module 3 into the recess 2 with a bonding agent. This step also increases the number of stages, thus making the manufacture of IC cards complicated.

SUMMARY OF THE INVENTION

The present invention has been accomplished to solve such problems of the conventional art. Accordingly, the object of the invention is to provide a manufacturing method for thin semiconductor device assembly which can readily and inexpensively manufacture thin semiconductor device assemblies.

According to the present invention, there is provided a manufacturing method for a thin semiconductor device assembly, comprising the steps of: forming an internal frame for positioning an IC module in an external frame which serves as the periphery of the thin semiconductor device assembly; positioning the IC module in the internal frame so that an electrode terminal surface of the IC module is exposed; and fixing the IC module in place by filling the external and internal frames with resin.

DESCRIPTION OF THE PREFERRED EMBODIMENTS

The embodiments of the present invention will be described hereinafter with reference to the accompanying drawings.

Figure 1A:
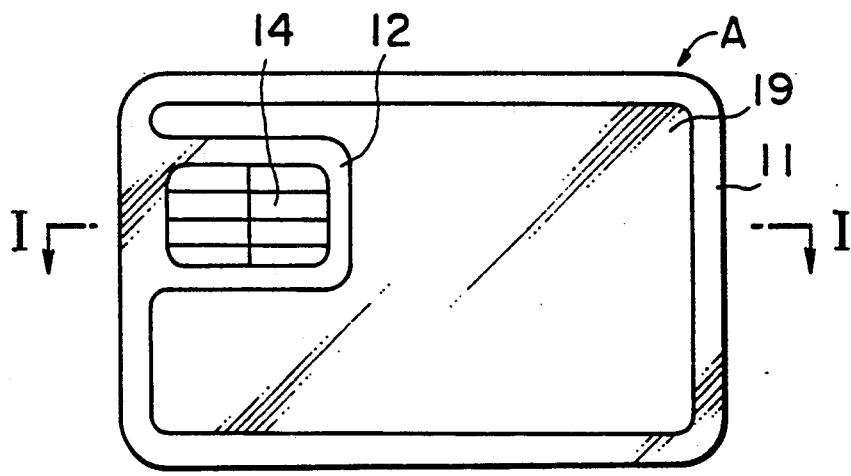
FIG. 1A is a plan view showing a thin semiconductor device assembly produced by a manufacturing method in accordance with the present invention.
Figure 1B:
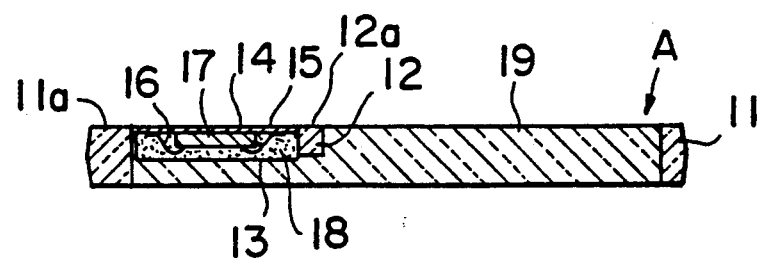
FIG. 1B is a cross-sectional view taken along line I—I of FIG. 1A.

FIGS. 1A and 1B show the construction of an IC card A manufactured according to an embodiment of the invention. In these drawings, the IC card A has a resin external frame 11 constituting the periphery of the IC card A. An internal frame 12 is disposed inside and integrally with the external frame 11. As shown in FIG. 1B, the internal frame 12 is thinner than the external frame 11. The upper surface 12a of the internal frame 12 is substantially flush with the upper surface 11a of the external frame 11, and is exposed at the surface of the IC card. An IC module 13 is disposed within the internal frame 12.

Figure 2:
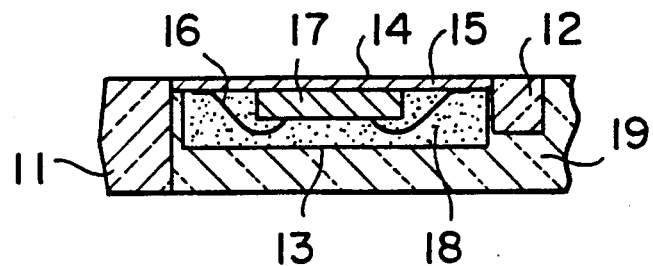
FIG. 2 is an enlarged view showing portions of FIG. 1B.

As shown in FIG. 2, the IC module 13 is provided with a circuit substrate 15 which has a first surface on which a wiring circuit (not shown) is disposed, and a second surface on which an electrode terminal 14 is formed. The IC module 13 is also provided with an IC 17 mounted on the first surface of the circuit substrate 15. Plural electrodes (not shown) of the IC 17 are connected through wires 16 to the wiring circuit of the circuit substrate 15. The wires 16, the IC 17 and other components are sealed by resin 18. The electrode terminals 14 formed on the second surface of the circuit substrate 15 are exposed at the surface of the IC card, as shown in FIG. 1A.

The inside of the external frame 11 is filled with resin 19 which fixes the IC module 13 in place.

Figure 3A:
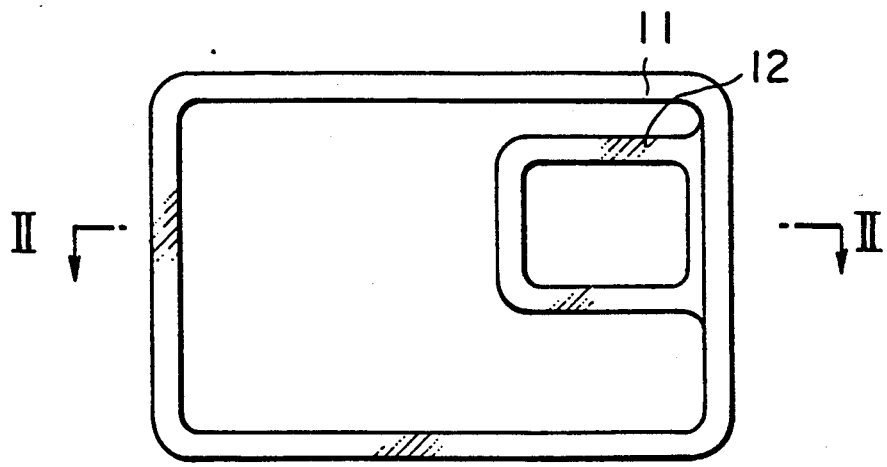
FIG. 3A is a plan view showing an external frame used for manufacturing the semiconductor device assembly of FIG. 1.
Figure 3B:
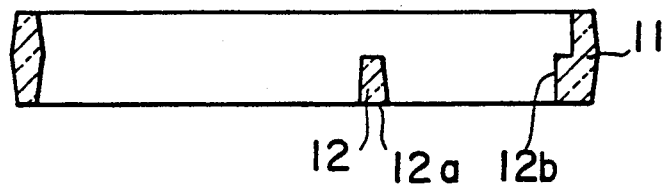
FIG. 3B is a cross-sectional view taken along line II—II of FIG. 3A.

A description will now be given of a method of manufacturing a thus-constructed IC card. First, as shown in FIGS. 3A and 3B, the external frame 11 made of resin is formed and includes the internal frame 12 for positioning the IC module. The internal frame 12 has a tapered inner side face 12b so that the opening of the internal frame 12 becomes narrower as it approaches the surface 12a that is exposed outside of the frame. The size of the opening in the internal frame 12 is slightly larger than the size of the external shape of the IC module 13. The internal frame 12 is also thicker than the circuit substrate on the IC module 13 and thinner than the external frame 11.

Figure 4:
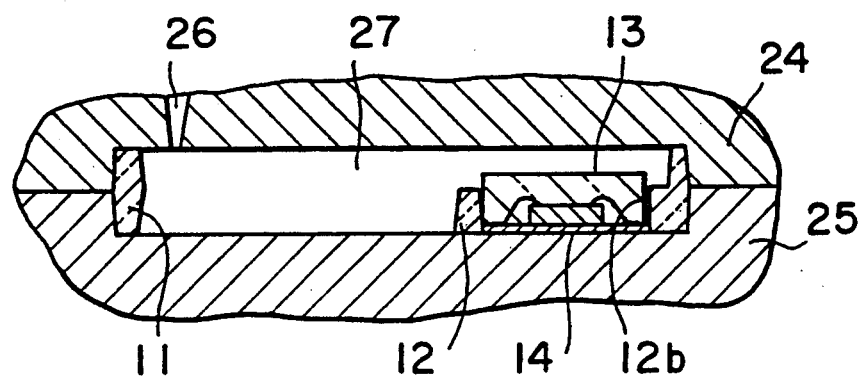
FIG. 4 is a cross-sectional view showing a stage while the semiconductor device assembly of FIG. 1A is manufactured.

Next, as illustrated in FIG. 4, the IC module 13 is positioned inside the internal frame 12 so that the electrode terminal 14 on the IC module 13 will be exposed at the outside surface of the card. The external frame 11, together with the IC module 13, is then placed in a cavity 27 formed by a pair of mold halves 24 and 25. A molten resin is thereafter injected into the cavity 27 through a gate 26 of the mold half 24. The IC card as shown in FIGS. 1A and 1B is obtained upon the setting of the resin.

Since the IC module 13 is fixed by the resin 19 in the external frame 11, it is possible to manufacture IC cards that conform to the industrial standard, even if the external shape of the IC module 13 is not precise.

Furthermore, because the IC module 13 is fixed while the resin 19 is injected for sealing, a welding stage, such as in the conventional method, is not required for the IC module 13. The number of stages in the manufacturing process is thereby reduced. In addition, even when there are variations in the shape and size of IC modules, homogeneous IC cards can be manufactured.

Moreover, by pigmenting the external frame 11 and the resin 19 with different colors, it is possible to readily manufacture IC cards having appealing appearances. If a transparent resin is used as the resins 18 and 19, it is also possible to see functional parts of the card from the outside. In addition, as required, designs can be made by printing or the like on the surface of the card. The card can thus be designed more freely.

Since the IC module 13 is fixed when the resin 19 is injected for sealing, the IC module 13 will not slip out of the internal frame 12 because of an external force that would be applied if the resin 19 were a rigid material. If, however, the resin 19 is a flexible material, to prevent the IC module 13 from slipping out of the internal frame 12, it is desirable to perform a primer treatment or a bonding agent treatment on the surface of the IC module 13. In the embodiment mentioned above, a thermotropic liquid crystal polymer is used as resin 19 and the external frame 11.

Figure 5A:
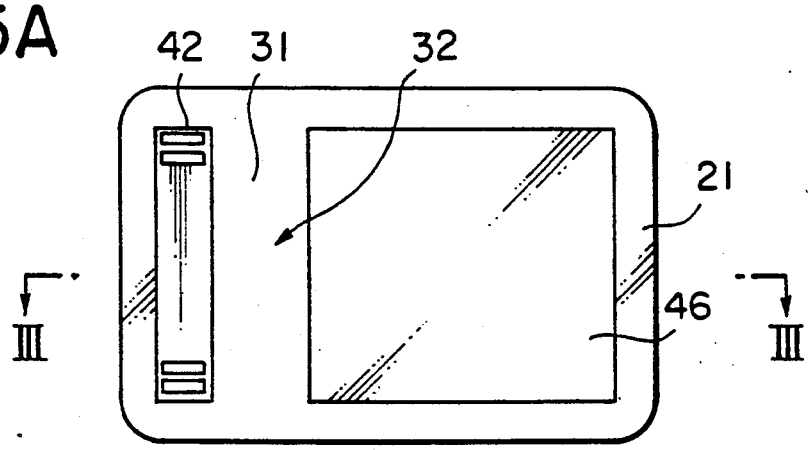
FIG. 5A is a plan view showing another semiconductor device assembly produced by the manufacturing method in accordance with this invention.
Figure 5B:
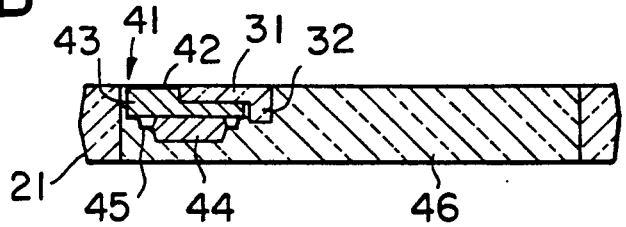
FIG. 5B is a cross-sectional view taken along line III—III of FIG. 5A.
Figure 6A:
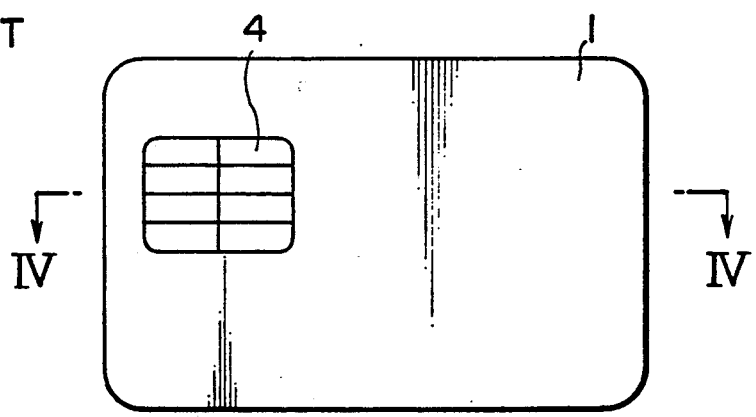
FIG. 6A is a plan view showing a semiconductor device assembly manufactured by the conventional method.
Figure 6B:
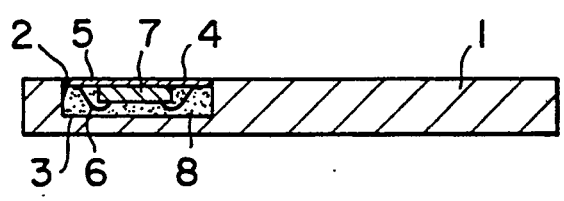
FIG. 6B is a cross-sectional view taken along line IV—IV of FIG. 6A.

Furthermore, the shape of the internal frame is not limited to that shown in FIGS. 3A and 3B. As shown in FIGS. 5A and 5B, for example, an internal frame 32 having a supporting portion 31 is formed integrally with an external frame 21. In such a case, an IC module 41 is formed so that a part of a circuit substrate 43 is positioned on the supporting portion 31 of the internal frame 32, and so that an electrode terminal 42 is exposed outside. An IC 44 and wires 45 on the circuit substrate 43 of the IC module 41 are not resin-sealed beforehand, but are sealed by the resin 46 that fills the external frame 21. Thus, since the IC module 41 is sealed by the resin 46 in the external frame 21, it is not required to seal beforehand the IC 44 and other components to form the IC module 41.

What is claimed is:

1. A manufacturing method for a thin semiconductor device assembly comprising sequentially:
   forming a unitary frame for a thin semiconductor device assembly including an external frame having opposed first and second surfaces and a side surface transverse to the first and second surfaces for forming a periphery of a thin semiconductor device assembly and an internal frame for positioning an IC module in the external frame;
   positioning an IC module including an integrated circuit and a substrate on which the integrated circuit is mounted, the substrate having an electrode terminal surface on which electrode terminals are disposed, in the internal frame so that the electrode terminal surface of the IC module is substantially coplanar with the second surface;
   filling the external and internal frames with a resin, thereby fixing the IC module in place within the unitary frame; and
   curing the resin.

2. A manufacturing method as claimed in claim 1 including forming the internal frame to include inner side surfaces transverse to the first and second surfaces that define an opening that becomes narrower from within the unitary frame toward the second surface of the unitary frame.

3. A manufacturing method as claimed in claim 1 including placing the unitary frame and IC module in a mold before filling the external and internal frames with a resin and filling the external and internal frames with the resin while the IC module is disposed in the internal frame and the unitary frame and the IC module are disposed in the mold.

4. A manufacturing method as claimed in claim 1 wherein the resin becomes rigid upon curing.

5. A manufacturing method as claimed in claim 1 wherein the resin is flexible after curing, and the IC module is in contact with the internal frame including treating the IC module to adhere the IC module to the internal frame.

6. A manufacturing method as claimed in claim 5 including treating the IC module with a primer.

7. A manufacturing method as claimed in claim 5 including treating the IC module with a bonding agent.

8. A manufacturing method as claimed in claim 1 including adding pigments so the external frame and resin are different colors.

* * * * *